United States Patent
Yamada et al.

(10) Patent No.: US 10,468,191 B2
(45) Date of Patent: Nov. 5, 2019

(54) MULTILAYER CERAMIC CAPACITOR AND MULTILAYER-CERAMIC-CAPACITOR-MOUNTED STRUCTURE

(71) Applicant: Murata Manufacturing Co., Ltd., Nagaokakyo-shi, Kyoto-fu (JP)

(72) Inventors: Tadateru Yamada, Nagaokakyo (JP); Kazuo Hattori, Nagaokakyo (JP); Isamu Fujimoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/832,903

(22) Filed: Dec. 6, 2017

(65) Prior Publication Data
US 2018/0197682 A1    Jul. 12, 2018

(30) Foreign Application Priority Data
Jan. 12, 2017    (JP) ................. 2017-003389

(51) Int. Cl.
| | |
|---|---|
| *H01G 4/30* | (2006.01) |
| *H01G 4/232* | (2006.01) |
| *H01G 2/06* | (2006.01) |
| *H01G 4/12* | (2006.01) |
| *H01G 4/005* | (2006.01) |
| *H01G 4/224* | (2006.01) |

(Continued)

(52) U.S. Cl.
CPC ............... *H01G 4/30* (2013.01); *H01G 2/065* (2013.01); *H01G 4/005* (2013.01); *H01G 4/12* (2013.01); *H01G 4/224* (2013.01); *H01G 4/232* (2013.01); *H05K 1/181* (2013.01); *H05K 3/3442* (2013.01); *H05K 2201/10015* (2013.01); *H05K 2201/10636* (2013.01); *H05K 2201/2045* (2013.01)

(58) Field of Classification Search
CPC ........................................................ H01G 4/30
See application file for complete search history.

(56) References Cited

U.S. PATENT DOCUMENTS

| | | | | |
|---|---|---|---|---|
| 4,771,520 | A | * | 9/1988 | Tanaka ............ H01G 4/30 29/25.42 |
| 5,712,758 | A | * | 1/1998 | Amano ............ H01G 4/2325 361/306.3 |

(Continued)

FOREIGN PATENT DOCUMENTS

JP    2013-251551 A    12/2013

*Primary Examiner* — Eric W Thomas
(74) *Attorney, Agent, or Firm* — Keating & Bennett, LLP

(57) ABSTRACT

A multilayer ceramic capacitor includes a stacked body and first and second external electrodes. When a dimension of the stacked body in a length direction is L0, a dimension of the stacked body in a width direction is W0, a dimension of the stacked body in a stacking direction is T0, a dimension of the first outer layer portion in the stacking direction is T1, a dimension of the second outer layer portion in the stacking direction is T2, a dimension of the first side margin in the width direction is W1, a dimension of the second side margin in the width direction is W2, a dimension of the first end margin in the length direction is L1, and a dimension of the second end margin in the length direction is L2, conditions of $(L1+L2)/L0 > (W1+W2)/W0$ and $(L1+L2)/L0 > (T1+T2)/T0$ are satisfied, and a condition of $0.244 \leq (L1+L2)/L0 \leq 0.348$ is satisfied.

18 Claims, 4 Drawing Sheets

(51) Int. Cl.
 *H05K 3/34* (2006.01)
 *H05K 1/18* (2006.01)

(56) References Cited

U.S. PATENT DOCUMENTS

| | | | | |
|---|---|---|---|---|
| 6,087,288 A | * | 7/2000 | Masumura | H01G 4/1227 501/138 |
| 2004/0140595 A1 | * | 7/2004 | Mihara | H01C 7/021 264/614 |
| 2008/0035244 A1 | * | 2/2008 | Suzuki | B22F 1/025 148/266 |
| 2009/0310276 A1 | * | 12/2009 | Tashima | H01G 4/012 361/303 |
| 2012/0257322 A1 | * | 10/2012 | Shiota | H01G 4/012 361/301.4 |
| 2013/0319741 A1 | | 12/2013 | Ahn et al. | |
| 2014/0166351 A1 | * | 6/2014 | Lee | H01G 2/06 174/258 |
| 2014/0185184 A1 | * | 7/2014 | Ahn | H01G 4/30 361/301.4 |
| 2015/0200054 A1 | * | 7/2015 | Lee | H01G 4/12 174/258 |

\* cited by examiner

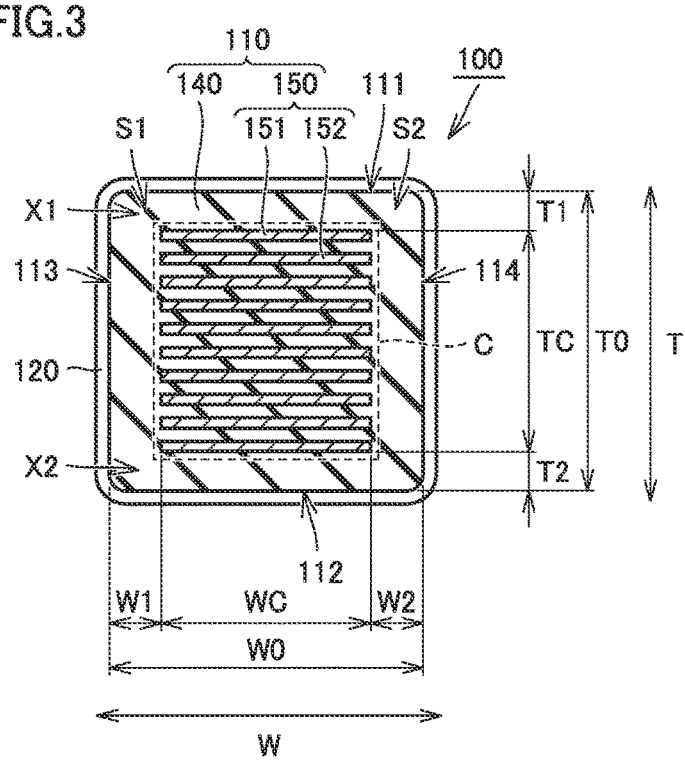

MULTILAYER CERAMIC CAPACITOR AND MULTILAYER-CERAMIC-CAPACITOR-MOUNTED STRUCTURE

CROSS REFERENCE TO RELATED APPLICATIONS

This application claims the benefit of priority to Japanese Patent Application No. 2017-003389 filed on Jan. 12, 2017. The entire contents of this application are hereby incorporated herein by reference.

BACKGROUND OF THE INVENTION

1. Field of the Invention

The present invention relates to a multilayer ceramic capacitor and a multilayer-ceramic-capacitor-mounted structure.

2. Description of the Related Art

One example of the prior art documents disclosing a configuration of a multilayer chip capacitor with reduced acoustic noise is Japanese Patent Laying-Open No. 2013-251551. A multilayer chip capacitor described in Japanese Patent Laying-Open No. 2013-251551 includes a ceramic body and an external electrode provided on a surface of the ceramic body. The ceramic body includes a dielectric layer and an internal electrode. The ceramic body includes an active region where the dielectric layer is arranged between the internal electrodes to generate a capacitance, an upper cover layer located above the active region, and a lower cover layer located below the active region. The lower cover layer is thicker than the upper cover layer.

When the thickness of the lower cover layer is increased to reduce the acoustic noise as in the multilayer chip capacitor described in Japanese Patent Laying-Open No. 2013-251551, the degree of reduction in capacitance of the multilayer chip capacitor is large.

SUMMARY OF THE INVENTION

Preferred embodiments of the present invention provide multilayer ceramic capacitors and multilayer-ceramic-capacitor-mounted structures, in which a reduction in capacitance is reduced or prevented and an acoustic noise is reduced.

A multilayer ceramic capacitor according to a preferred embodiment of the present invention includes a stacked body; a first external electrode; and a second external electrode. The stacked body includes a plurality of dielectric layers and a plurality of internal electrode layers alternately stacked along a stacking direction. The stacked body includes a first main surface and a second main surface facing each other in the stacking direction, a first side surface and a second side surface facing each other in a width direction orthogonal or substantially orthogonal to the stacking direction, and a first end surface and a second end surface facing each other in a length direction orthogonal or substantially orthogonal to both of the stacking direction and the width direction. The first external electrode is provided on the first end surface. The second external electrode is provided on the second end surface. The plurality of internal electrode layers include a first internal electrode layer connected to the first external electrode and a second internal electrode layer connected to the second external electrode. The stacked body is partitioned into an inner layer portion, a first outer layer portion, a second outer layer portion, a first side margin, a second side margin, a first end margin, and a second end margin. The inner layer portion is a portion in which facing portions of the first internal electrode layer and the second internal electrode layer facing each other are stacked in the stacking direction to provide a capacitance. The first outer layer portion is located on a first main surface side of the inner layer portion in the stacking direction. The second outer layer portion is located on a second main surface side of the inner layer portion in the stacking direction. The first side margin is located on a first side surface side of the inner layer portion in the width direction. The second side margin is located on a second side surface side of the inner layer portion in the width direction. The first end margin is located on a first end surface side of the inner layer portion in the length direction. The second end margin is located on a second end surface side of the inner layer portion in the length direction. When a dimension of the stacked body in the length direction is defined as $L0$, a dimension of the stacked body in the width direction is defined as $W0$, a dimension of the stacked body in the stacking direction is defined as $T0$, a dimension of the first outer layer portion in the stacking direction is defined as $T1$, a dimension of the second outer layer portion in the stacking direction is defined as $T2$, a dimension of the first side margin in the width direction is defined as $W1$, a dimension of the second side margin in the width direction is defined as $W2$, a dimension of the first end margin in the length direction is defined as $L1$, and a dimension of the second end margin in the length direction is defined as $L2$, conditions of $(L1+L2)/L0 > (W1+W2)/W0$ and $(L1+L2)/L0 > (T1+T2)/T0$ are satisfied, and a condition of $0.244 \leq (L1+L2)/L0 \leq 0.348$ is satisfied.

In a preferred embodiment of the present invention, $T1=T2$.

A multilayer-ceramic-capacitor-mounted structure according to a preferred embodiment of the present invention includes the multilayer ceramic capacitor described above; and a substrate including the multilayer ceramic capacitor mounted on a surface thereof. The stacking direction is perpendicular or substantially perpendicular to the surface of the substrate.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is a cross-sectional view of the multilayer ceramic capacitor in FIG. 1 as seen from a direction of an arrow of line III-III.

FIG. 4 is a cross-sectional view of the multilayer ceramic capacitor in FIG. 2 as seen from a direction of an arrow of line IV-IV.

DETAILED DESCRIPTION OF THE PREFERRED EMBODIMENTS

Figure 1:
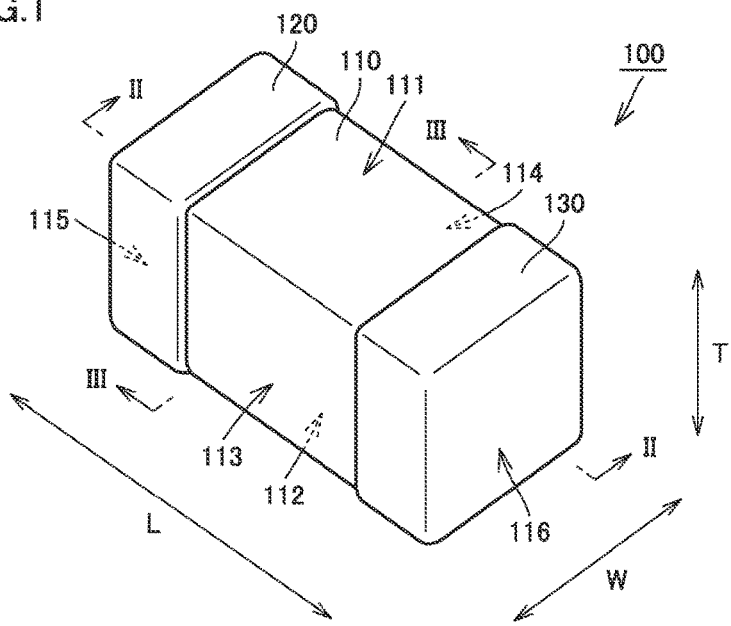
FIG. 1 is a perspective view illustrating a multilayer ceramic capacitor according to a preferred embodiment of the present invention.

Multilayer ceramic capacitors and multilayer-ceramic-capacitor-mounted structures according to preferred embodiments of the present invention will be described hereinafter with reference to the drawings. In the following description of the preferred embodiments, the same or corresponding portions in the drawings are denoted by the same reference characters and description thereof will not be repeated.

Figure 2:
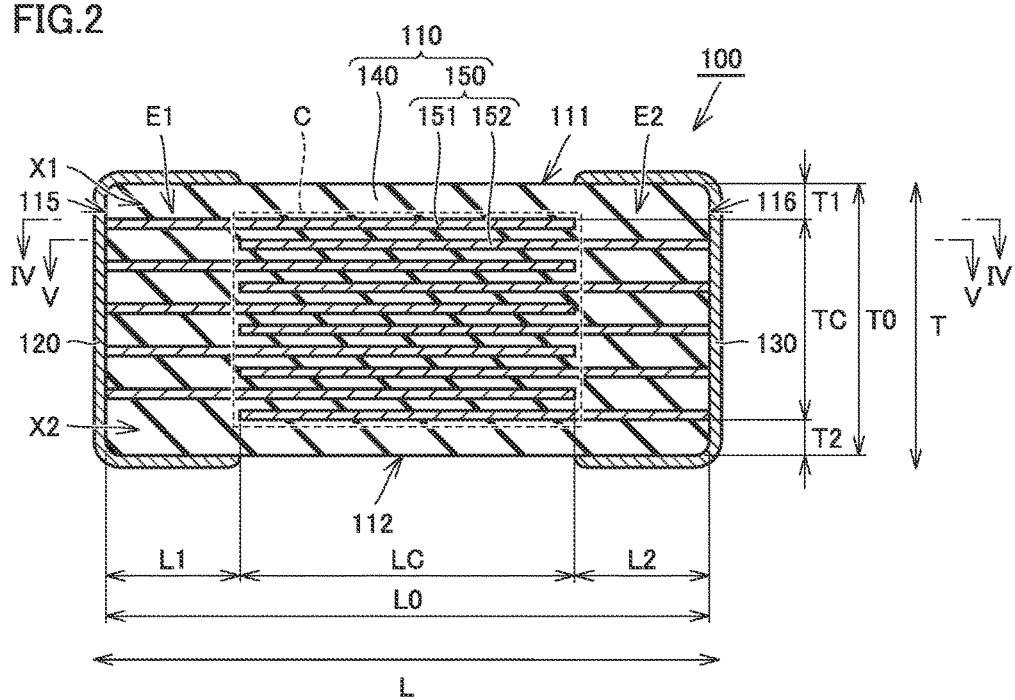
FIG. 2 is a cross-sectional view of the multilayer ceramic capacitor in FIG. 1 as seen from a direction of an arrow of line II-II.
Figure 5:
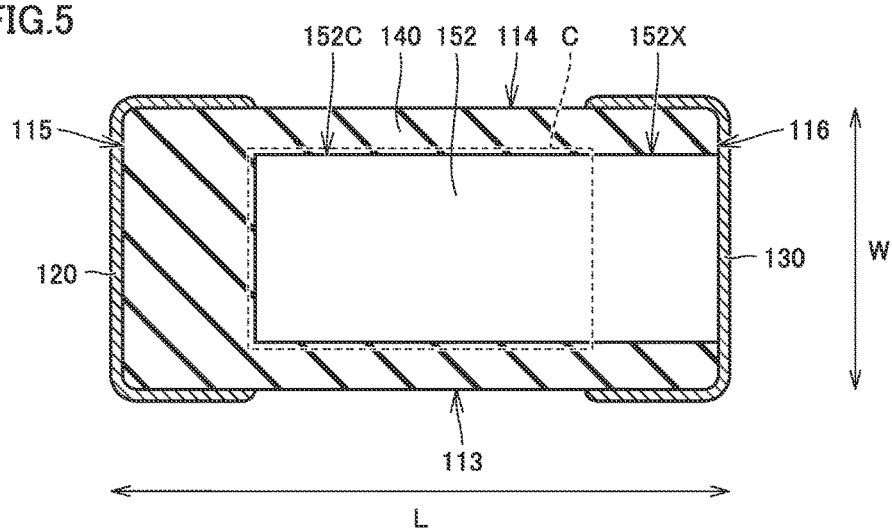
FIG. 5 is a cross-sectional view of the multilayer ceramic capacitor in FIG. 2 as seen from a direction of an arrow of line V-V.

FIG. 1 is a perspective view illustrating a multilayer ceramic capacitor according to a preferred embodiment of the present invention. FIG. 2 is a cross-sectional view of the multilayer ceramic capacitor in FIG. 1 as seen from a direction of an arrow of line II-II. FIG. 3 is a cross-sectional view of the multilayer ceramic capacitor in FIG. 1 as seen from a direction of an arrow of line III-III. FIG. 4 is a cross-sectional view of the multilayer ceramic capacitor in FIG. 2 as seen from a direction of an arrow of line IV-IV. FIG. 5 is a cross-sectional view of the multilayer ceramic capacitor in FIG. 2 as seen from a direction of an arrow of line V-V. In FIG. 1 to FIG. 5, L represents a length direction of a stacked body described below, W represents a width direction of the stacked body, and T represents a stacking direction of the stacked body.

As illustrated in FIG. 1 to FIG. 5, a multilayer ceramic capacitor 100 according to a preferred embodiment of the present invention includes a stacked body 110, a first external electrode 120 and a second external electrode 130. Stacked body 110 includes a plurality of dielectric layers 140 and a plurality of internal electrode layers 150 alternately stacked one by one along a stacking direction T.

Stacked body 110 includes a first main surface 111 and a second main surface 112 facing each other in the stacking direction T, a first side surface 113 and a second side surface 114 facing each other in the width direction W orthogonal or substantially orthogonal to stacking direction T, and a first end surface 115 and a second end surface 116 facing each other in the length direction L orthogonal or substantially orthogonal to both stacking direction T and width direction W. First external electrode 120 is provided on first end surface 115. Second external electrode 130 is provided on second end surface 116.

The plurality of internal electrode layers 150 include a plurality of first internal electrode layers 151 connected to first external electrode 120, and a plurality of second internal electrode layers 152 connected to second external electrode 130. As illustrated in FIG. 4, first internal electrode layers 151 include a facing portion 151C facing second internal electrode layers 152, and a drawn-out portion 151X drawn out to first end surface 115. As illustrated in FIG. 5, second internal electrode layers 152 include a facing portion 152C facing first internal electrode layers 151, and a drawn-out portion 152X drawn out to second end surface 116.

As illustrated in FIG. 2 to FIG. 5, stacked body 110 is partitioned into an inner layer portion C, a first outer layer portion X1, a second outer layer portion X2, a first side margin S1, a second side margin S2, a first end margin E1, and a second end margin E2.

In inner layer portion C, facing portion 151C of first internal electrode layers 151 and facing portion 152C of second internal electrode layers 152 are stacked in stacking direction T to provide a capacitance. First outer layer portion X1 is located on a first main surface 111 side of inner layer portion C in stacking direction T. Second outer layer portion X2 is located on a second main surface 112 side of inner layer portion C in stacking direction T.

First side margin S1 is located on a first side surface 113 side of inner layer portion C in width direction W. Second side margin S2 is located on a second side surface 114 side of inner layer portion C in width direction W. First end margin E1 is located on a first end surface 115 side of inner layer portion C in length direction L. Second end margin E2 is located on a second end surface 116 side of inner layer portion C in length direction L.

When a dimension of stacked body 110 in length direction L is defined as L0, a dimension of stacked body 110 in width direction W is defined as W0, a dimension of stacked body 110 in stacking direction T is defined as T0, a dimension of first outer layer portion X1 in stacking direction T is defined as T1, a dimension of second outer layer portion X2 in stacking direction T is defined as T2, a dimension of first side margin S1 in width direction W is defined as W1, a dimension of second side margin S2 in width direction W is defined as W2, a dimension of first end margin E1 in length direction L is defined as L1, and a dimension of second end margin E2 in length direction L is defined as L2, conditions of $(L1+L2)/L0>(W1+W2)/W0$ and $(L1+L2)/L0>(T1+T2)/T0$ are satisfied, and a condition of $0.244 \le (L1+L2)/L0 \le 0.348$ is satisfied.

The components of multilayer ceramic capacitor 100 will be described in detail below.

Stacked body 110 preferably has a rectangular or substantially rectangular parallelepiped outer shape. Dimension L0 of stacked body 110 in length direction L is larger than dimension W0 of stacked body 110 in width direction W. Dimension L0 of stacked body 110 in length direction L is larger than dimension T0 of stacked body 110 in stacking direction T. In the present preferred embodiment, dimension W0 of stacked body 110 in width direction W and dimension T0 of stacked body 110 in stacking direction T are preferably equal or substantially equal to each other. However, dimension W0 of stacked body 110 in width direction W and dimension T0 of stacked body 110 in stacking direction T may be different from each other. The dimensions being equal or substantially equal to each other includes a difference between the dimensions falling within about 5%, for example.

In the present preferred embodiment, preferably, the dimension of stacked body 110 in length direction L is not larger than about 1.75 mm, the dimension of stacked body 110 in width direction W is not larger than about 0.95 mm, and the dimension of stacked body 110 in stacking direction T is not larger than about 0.95 mm, for example.

In the present preferred embodiment, preferably, a dimension of multilayer ceramic capacitor 100 in length direction L is not larger than about 2.0 mm, a dimension of multilayer ceramic capacitor 100 in width direction W is not larger than about 1.25 mm, and a dimension of multilayer ceramic capacitor 100 in stacking direction T is not larger than about 1.25 mm, for example. The external dimension of multilayer ceramic capacitor 100 are able to be measured by observing multilayer ceramic capacitor 100 with an optical microscope.

It is preferable that a corner portion and a ridge portion of stacked body 110 are rounded. The corner portion is a portion where the three surfaces of stacked body 110 intersect with one another, and the ridge portion is a portion where the two surfaces of stacked body 110 intersect with each other. Recesses and protrusions may be provided on at least one of first main surface 111, second main surface 112, first side surface 113, second side surface 114, first end surface 115, and second end surface 116.

In the present preferred embodiment, dimension T1 of first outer layer portion X1 in stacking direction T and dimension T2 of second outer layer portion X2 in stacking direction T are preferably equal or substantially equal to each other. In other words, T1=T2.

In addition, dimension W1 of first side margin S1 in width direction W and dimension W2 of second side margin S2 in width direction W are preferably equal or substantially equal to each other. In other words, W1=W2.

Furthermore, dimension L1 of first end margin E1 in length direction L and dimension L2 of second end margin E2 in length direction L are preferably equal or substantially equal to each other. In other words, L1=L2.

A dimension of inner layer portion C in length direction L is defined as LC, a dimension of inner layer portion C in width direction W is defined as WC, and a dimension of inner layer portion C in stacking direction T is defined as TC. LC is defined as LC=L0−(L1+L2). WC is defined as WC=W0−(W1+W2). TC is defined as TC=T0−(T1+T2).

A thickness of each of the plurality of dielectric layers 140 included in inner layer portion C is preferably not smaller than about 0.5 μm and not greater than about 5 μm, and more preferably not smaller than about 0.5 μm and not greater than about 2 μm, for example.

Dielectric layer 140 is preferably composed of a Perovskite compound including Ba or Ti, for example. As a material used for dielectric layer 140, dielectric ceramics primarily composed of $BaTiO_3$, $CaTiO_3$, $SrTiO_3$, $CaZrO_3$ or other suitable ceramics, for example, may preferably be used. A material to which an Mn compound, an Mg compound, an Si compound, an Fe compound, a Cr compound, a Co compound, an Ni compound, an Al compound, a V compound, a rare earth compound or other suitable compound added as a sub-component to the above-described main component, for example, may also preferably be used. A dielectric constant of the material forming dielectric layer 140 is preferably not lower than about 1000, for example.

A thickness of each of the plurality of internal electrode layers 150 is preferably not smaller than about 0.3 μm and not greater than about 1.0 μm, for example. A coverage rate indicating that each of the plurality of internal electrode layers 150 covers dielectric layer 140 without any gap is preferably not lower than about 50% and not higher than about 95%, for example.

As a material for internal electrode layer 150, one type of metal selected from the group consisting of Ni, Cu, Ag, Pd, and Au, or an alloy including this metal, such as, for example, an alloy of Ag and Pd, may preferably be used. Internal electrode layer 150 may preferably include dielectric particles having the same composition as that of the dielectric ceramics included in dielectric layer 140.

As illustrated in FIG. 4 and FIG. 5, each of first internal electrode layers 151 and second internal electrode layers 152 preferably has a rectangular or substantially rectangular shape as seen from stacking direction T of stacked body 110. As illustrated in FIG. 2 and FIG. 3, first internal electrode layers 151 and second internal electrode layers 152 are alternately arranged at regular intervals in stacking direction T of stacked body 110. In addition, first internal electrode layer 151 and second internal electrode layer 152 are arranged to face each other with dielectric layer 140 interposed therebetween. Since dielectric layer 140 is located between facing portion 151C of first internal electrode layer 151 and facing portion 152C of second internal electrode layer 152, a capacitance is provided. As a result, the function of the capacitor is provided.

Each of first external electrode 120 and second external electrode 130 includes a base electrode layer and a plated layer provided on the base electrode layer. The base electrode layer includes at least one of a baked layer, a resin layer, and a thin film layer. A thickness of the base electrode layer is preferably not smaller than about 10 μm and not greater than about 50 μm, more preferably not greater than about 25 μm, and further preferably not greater than about 15 μm, for example.

The baked layer includes glass and metal. As a metal material forming the baked layer, one type of metal selected from the group consisting of Ni, Cu, Ag, Pd, and Au, or an alloy including this metal, such as, for example, an alloy of Ag and Pd, may preferably be used. The glass preferably includes Si and Zn, for example. The baked layer may include a plurality of stacked layers. The baked layer may be a layer formed by applying and baking a conductive paste onto stacked body 110, or a layer fired simultaneously with internal electrode layers 150.

The resin layer includes conductive particles and a thermosetting resin. When the resin layer is provided, the resin layer may be directly provided on stacked body 110 without providing the baked layer. The resin layer may include a plurality of stacked layers. A maximum thickness of the resin layer is preferably not smaller than about 5 μm and not greater than about 20 μm, for example.

The thin film layer is preferably formed by a thin film formation method, such as a sputtering method or a vapor deposition method, for example. The thin film layer is preferably a layer of not greater than about 1 μm thickness, for example, in which metal particles are deposited.

As a material used for the plated layer, one type of metal selected from the group consisting of Ni, Cu, Ag, Pd, and Au, or an alloy including this metal, such as, for example, an alloy of Ag and Pd, may preferably be used.

The plated layer may include a plurality of stacked layers. In this case, it is preferable that the plated layer has a two-layer structure in which an Sn-plated layer is provided on an Ni-plated layer, for example. The Ni-plated layer has the function of preventing the base electrode layer from being eroded by the solder used when mounting multilayer ceramic capacitor 100. The Sn-plated layer has the function of enhancing the wettability with the solder used when mounting multilayer ceramic capacitor 100, and facilitating mounting of multilayer ceramic capacitor 100.

An average thickness of the Ni-plated layer is preferably not smaller than about 0.5 μm and not greater than about 10 μm, more preferably not greater than about 4.5 μm, and further preferably not greater than about 3.7 μm, for example. An average thickness of the Sn-plated layer is preferably not smaller than about 0.5 μm and not greater than about 10 μm, more preferably not greater than about 4.5 μm, and further preferably not greater than about 3.7 μm, for example.

Now, a non-limiting example of a method for measuring the dimensions of the components will be described.

The thickness of each of dielectric layers 140 and internal electrode layers 150 included in inner layer portion C is measured as follows. First, multilayer ceramic capacitor 100 is polished to expose a cross section orthogonal or substantially orthogonal to length direction L. The exposed cross section is observed with a scanning electron microscope. Next, measurement is performed of the thickness of each of dielectric layers 140 and internal electrode layers 150 on five lines in total, i.e., a center line along stacking direction T passing through the center of the exposed cross section as well as two lines drawn from this center line toward one side at regular intervals and two lines drawn from this center line toward the other side at regular intervals. An average value of the five measurement values of dielectric layers 140 is defined as the thickness of dielectric layer 140. An average value of the five measurement values of internal electrode layers 150 is defined as the thickness of internal electrode layer 150.

In each of an upper portion, a middle portion, and a lower portion located on a boundary line that divides the exposed cross section into four portions in stacking direction T, measurement may be performed of the thickness of each of dielectric layers 140 and internal electrode layers 150 on the above-described five lines, and an average value of the measurement values of dielectric layers 140 may be defined as the thickness of dielectric layer 140 and an average value of the measurement values of internal electrode layers 150 may be defined as the thickness of internal electrode layer 150.

Each of dimension W0 of stacked body 110 in width direction W and dimension T0 of stacked body 110 in stacking direction T is measured by observing, with an optical microscope, a portion of stacked body 110 not covered with first external electrode 120 and second external electrode 130. A measurement position is a central portion in length direction L.

Dimension L0 of stacked body 110 in length direction L is measured as follows. First, multilayer ceramic capacitor 100 is polished to expose a cross section orthogonal to width direction W. The exposed cross section is observed with a microscope and dimension L0 is measured. A measurement position is a central portion in stacking direction T.

Each of dimension T1 of first outer layer portion X1 in stacking direction T and dimension T2 of second outer layer portion X2 in stacking direction T is measured as follows. First, multilayer ceramic capacitor 100 is polished to expose a cross section orthogonal to width direction W. The exposed cross section is observed with a microscope and dimension T1 and dimension T2 are measured. A measurement position is the central portion in length direction L.

Each of dimension L1 of first end margin E1 in length direction L and dimension L2 of second end margin E2 in length direction L is measured as follows. First, multilayer ceramic capacitor 100 is polished to expose a cross section orthogonal or substantially orthogonal to width direction W. The exposed cross section is observed with a microscope and dimension L1 and dimension L2 are measured. Measurement positions are an upper portion, a middle portion, and a lower portion located on a boundary line that divides the exposed cross section into four portions in stacking direction T. An average value of the measurement values of first end margin E1 at these three locations is defined as dimension L1 of first end margin E1 in length direction L, and an average value of the measurement values of second end margin E2 at these three locations is defined as dimension L2 of second end margin E2 in length direction L.

The thickness of each of first side margin S1 and second side margin S2 is measured as follows. First, multilayer ceramic capacitor 100 is polished to expose a cross section orthogonal or substantially orthogonal to length direction L. The exposed cross section is observed with a microscope and measured. Measurement positions are an upper portion, a middle portion, and a lower portion located on a boundary line that divides the exposed cross section into four portions in stacking direction T. An average value of the measurement values of first side margin S1 at these three locations is defined as dimension W1 of first side margin S1 in width direction W, and an average value of the measurement values of second side margin S2 at these three locations is defined as dimension W2 of second side margin S2 in width direction W.

The thickness of the base electrode layer is measured as follows. First, multilayer ceramic capacitor 100 is polished to expose a cross section orthogonal or substantially orthogonal to width direction W. The exposed cross section is observed with a microscope and measured. A measurement position is the central portion in stacking direction T.

The thicknesses of the Ni-plated layer and the Sn-plated layer are measured using a fluorescent X-ray film thickness meter. When the thickness of the Ni-plated layer is measured, measurement is performed after removing the Sn-plated layer using a remover, such as Enstrip or Melstrip, to expose the Ni-plated layer.

A non-limiting example of a method for manufacturing multilayer ceramic capacitor 100 according to a preferred embodiment of the present invention will be described below. The method for manufacturing multilayer ceramic capacitor 100 described below is a method for mass-producing a plurality of multilayer ceramic capacitors 100 simultaneously by collectively performing the processing treatment halfway through the manufacturing process to fabricate a mother stacked body, and thereafter, cutting and dividing the mother stacked body into individual pieces, and further performing the processing treatment on a divided soft stacked body.

When multilayer ceramic capacitor 100 is manufactured, ceramic slurry is first prepared. Specifically, a ceramic powder, a binder, a solvent and other suitable ingredients are mixed at a prescribed blending ratio, to form the ceramic slurry.

Next, a ceramic green sheet is formed. Specifically, the ceramic slurry is shaped into a sheet on a carrier film using a die coater, a gravure coater, a microgravure coater or other suitable coater, to thereby form the ceramic green sheet.

Next, a mother sheet is formed. Specifically, a conductive paste is printed on the ceramic green sheet using a screen printing method, a gravure printing method or other suitable method so as to have a prescribed pattern, to form the mother sheet including the prescribed conductive pattern on the ceramic green sheet.

In addition to the mother sheet including the conductive pattern, a ceramic green sheet not including a conductive pattern is also prepared as the mother sheet.

Next, the mother sheets are stacked. Specifically, the prescribed number of mother sheets forming first outer layer portion X1 and not including the conductive pattern are stacked, and a plurality of mother sheets forming inner layer portion C and including the conductive pattern are sequentially stacked on the prescribed number of mother sheets, and the prescribed number of mother sheets forming second outer layer portion X2 and not including the conductive pattern are stacked on the plurality of mother sheets. A group of mother sheets are thereby formed.

Next, the group of mother sheets are compression-bonded. The group of mother sheets are pressurized and compression-bonded along stacking direction T using isostatic pressing or rigid body pressing, to form a mother stacked body.

Next, the mother stacked body is cut. Specifically, the mother stacked body is cut in a matrix manner using press-cutting or dicing, and divided into a plurality of soft stacked bodies.

Next, the soft stacked bodies are barrel-polished. Specifically, the soft stacked bodies are placed into a small box called a "barrel", together with a media ball having a hardness higher than that of the ceramic material, and the barrel is rotated, to round corner portions and ridge portions of the soft stacked bodies so as to have a curved surface.

Next, the soft stacked bodies are fired. Specifically, the soft stacked bodies are heated to a prescribed temperature to fire the dielectric ceramics material. The firing temperature is set as appropriate depending on the type of the dielectric ceramics material, and is preferably set to be within the range of not lower than about 900° C. and not higher than about 1300° C., for example.

Next, a base electrode layer is formed on a surface of stacked body 110. Specifically, a base electrode layer of each of first external electrode 120 and second external electrode 130 is formed using various types of thin film formation methods, various types of printing methods, a dipping method or other suitable methods. For example, when the base electrode layer is formed using the dipping method, a conductive paste is applied to first end surface 115 and second end surface 116 of stacked body 110, and thereafter, the conductive paste is baked. The conductive paste includes an organic solvent, metal particles and glass. In the present preferred embodiment, the baking temperature is preferably about 840° C., for example.

Next, plated layers are formed by the plating treatment to cover the base electrode layers. The plated layers are formed, and thus, first external electrode 120 and second external electrode 130 are formed.

Through the series of steps described above, multilayer ceramic capacitor 100 is manufactured.

Figure 6:
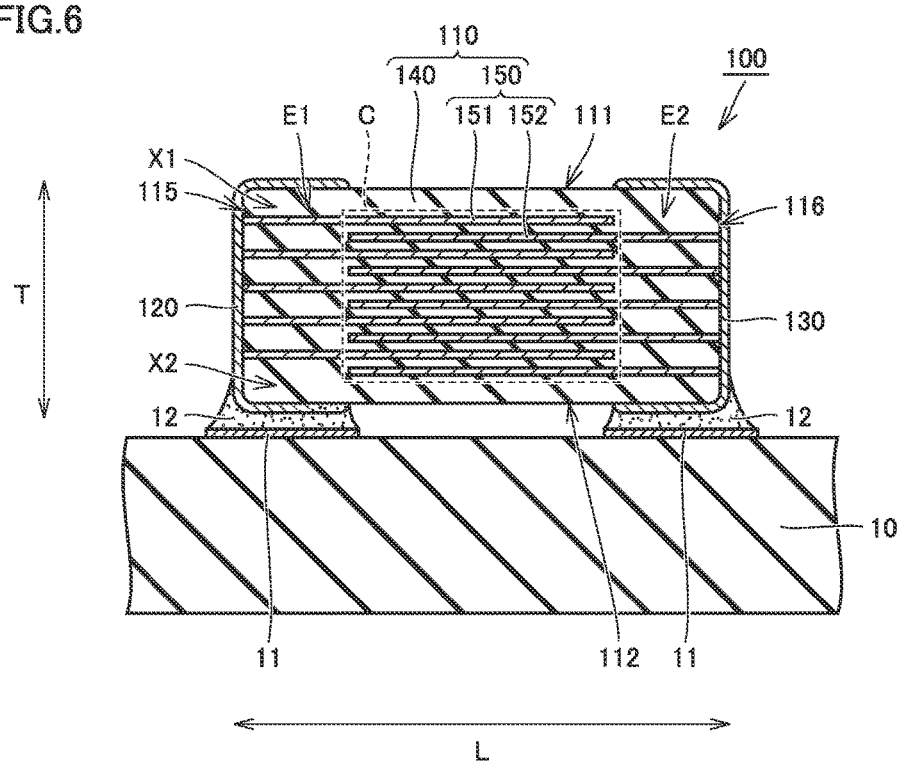
FIG. 6 is a cross-sectional view illustrating a configuration of a multilayer-ceramic-capacitor-mounted structure according to a preferred embodiment of the present invention.

FIG. 6 is a cross-sectional view illustrating a configuration of a multilayer-ceramic-capacitor-mounted structure according to a preferred embodiment of the present invention. As illustrated in FIG. 6, the multilayer-ceramic-capacitor-100-mounted structure according to a preferred embodiment of the present invention includes multilayer ceramic capacitor 100 and a substrate 10 including multilayer ceramic capacitor 100 mounted on a surface thereof. Stacking direction T of stacked body 110 is perpendicular or substantially perpendicular to the surface of substrate 10. Second main surface 112 of multilayer ceramic capacitor 100 and the surface of substrate 10 face each other.

A pair of lands 11 are provided on the surface of substrate 10 to correspond to first external electrode 120 and second external electrode 130 of multilayer ceramic capacitor 100. One of the pair of lands 11 and first external electrode 120 are joined to each other by solder 12. The other of the pair of lands 11 and second external electrode 130 are joined to each other by solder 12.

An experimental example will be described below. In the experimental example, the magnitude relation among (L1+L2)/L0, (W1+W2)/W0 and (T1+T2)/T0 was changed in the multilayer-ceramic-capacitor-mounted structure, and simulation analysis was performed of a change in capacitance of the multilayer ceramic capacitor and a change in amplitude of vibrations of the substrate having the multilayer ceramic capacitor mounted thereon.

In the present experimental example, simulation analysis was performed of 26 types of samples of the multilayer-ceramic-capacitor-mounted structures. Table 1 shows the dimensional conditions, the capacitance of the multilayer ceramic capacitor, and the amplitude of vibrations of the substrate having the multilayer ceramic capacitor mounted thereon for each of Sample 1 to Sample 26.

TABLE 1

|  | L0 (mm) | W0 (mm) | T0 (mm) | L1, L2 (μm) | W1, W2 (μm) | T1, T2 (μm) | (L1 + L2)/L0 | (W1 + W2)/W0 | (T1 + T2)/T0 | capacitance (μF) | amplitude (nm) |
|---|---|---|---|---|---|---|---|---|---|---|---|
| Sample 1 | 1.148 | 0.678 | 0.675 | 60 | 60 | 60 | 0.105 | 0.177 | 0.178 | 10.0 | 26.53 |
| Sample 2 | 1.148 | 0.678 | 0.675 | 60 | 100 | 60 | 0.105 | 0.295 | 0.178 | 8.48 | 24.07 |
| Sample 3 | 1.148 | 0.678 | 0.675 | 60 | 150 | 60 | 0.105 | 0.442 | 0.178 | 6.58 | 20.13 |
| Sample 4 | 1.148 | 0.678 | 0.675 | 60 | 200 | 60 | 0.105 | 0.590 | 0.178 | 4.69 | 15.25 |
| Sample 5 | 1.148 | 0.678 | 0.675 | 60 | 60 | 100 | 0.105 | 0.177 | 0.296 | 8.45 | 19.97 |
| Sample 6 | 1.148 | 0.678 | 0.675 | 60 | 60 | 150 | 0.105 | 0.177 | 0.444 | 6.50 | 13.96 |
| Sample 7 | 1.148 | 0.678 | 0.675 | 60 | 60 | 200 | 0.105 | 0.177 | 0.593 | 4.56 | 10.29 |
| Sample 8 | 1.148 | 0.678 | 0.675 | 100 | 60 | 60 | 0.174 | 0.177 | 0.178 | 9.17 | 22.32 |
| Sample 9 | 1.148 | 0.678 | 0.675 | 110 | 60 | 60 | 0.192 | 0.177 | 0.178 | 8.97 | 21.32 |
| Sample 10 | 1.148 | 0.678 | 0.675 | 120 | 60 | 60 | 0.209 | 0.177 | 0.178 | 8.76 | 20.30 |
| Sample 11 | 1.148 | 0.678 | 0.675 | 130 | 60 | 60 | 0.226 | 0.177 | 0.178 | 8.55 | 19.26 |
| Sample 12 | 1.148 | 0.678 | 0.675 | 140 | 60 | 60 | 0.244 | 0.177 | 0.178 | 8.35 | 18.15 |
| Sample 13 | 1.148 | 0.678 | 0.675 | 150 | 60 | 60 | 0.261 | 0.177 | 0.178 | 8.14 | 17.15 |
| Sample 14 | 1.148 | 0.678 | 0.675 | 160 | 60 | 60 | 0.279 | 0.177 | 0.178 | 7.93 | 15.72 |
| Sample 15 | 1.148 | 0.678 | 0.675 | 170 | 60 | 60 | 0.296 | 0.177 | 0.178 | 7.72 | 14.40 |
| Sample 16 | 1.148 | 0.678 | 0.675 | 180 | 60 | 60 | 0.314 | 0.177 | 0.178 | 7.52 | 13.14 |
| Sample 17 | 1.148 | 0.678 | 0.675 | 190 | 60 | 60 | 0.331 | 0.177 | 0.178 | 7.31 | 11.85 |
| Sample 18 | 1.148 | 0.678 | 0.675 | 200 | 60 | 60 | 0.348 | 0.177 | 0.178 | 7.10 | 10.47 |
| Sample 19 | 1.148 | 0.678 | 0.675 | 210 | 60 | 60 | 0.366 | 0.177 | 0.178 | 6.90 | 9.32 |
| Sample 20 | 1.148 | 0.678 | 0.675 | 220 | 60 | 60 | 0.383 | 0.177 | 0.178 | 6.69 | 8.17 |
| Sample 21 | 1.148 | 0.678 | 0.675 | 230 | 60 | 60 | 0.401 | 0.177 | 0.178 | 6.48 | 7.24 |
| Sample 22 | 1.148 | 0.678 | 0.675 | 240 | 60 | 60 | 0.418 | 0.177 | 0.178 | 6.28 | 6.30 |
| Sample 23 | 1.148 | 0.678 | 0.675 | 250 | 60 | 60 | 0.436 | 0.177 | 0.178 | 6.07 | 5.33 |
| Sample 24 | 1.148 | 0.678 | 0.675 | 280 | 60 | 60 | 0.488 | 0.177 | 0.178 | 5.45 | 3.88 |
| Sample 25 | 1.148 | 0.678 | 0.675 | 300 | 60 | 60 | 0.523 | 0.177 | 0.178 | 5.04 | 3.50 |
| Sample 26 | 1.148 | 0.678 | 0.675 | 310 | 60 | 60 | 0.540 | 0.177 | 0.178 | 4.83 | 3.41 |

As shown in Table 1, in each of Sample 1 to Sample 26, L0 was set at about 1.148 mm, W0 was set at about 0.678 mm, and T0 was set at about 0.675 mm. In each of Sample 1 to Sample 26, L1=L2, W1=W2 and T1=T2 were set.

Each of L1 and L2 was set at about 60 μm in Sample 1, about 60 μm in Sample 2, about 60 μm in Sample 3, about 60 μm in Sample 4, about 60 μm in Sample 5, about 60 μm in Sample 6, about 60 μm in Sample 7, about 100 μm in Sample 8, about 110 μm in Sample 9, about 120 μm in Sample 10, about 130 μm in Sample 11, about 140 μm in Sample 12, about 150 μm in Sample 13, about 160 μm in Sample 14, about 170 µm in Sample 15, about 180 µm in Sample 16, about 190 µm in Sample 17, about 200 µm in Sample 18, about 210 µm in Sample 19, about 220 µm in Sample 20, about 230 µm in Sample 21, about 240 µm in Sample 22, about 250 µm in Sample 23, about 280 µm in Sample 24, about 300 µm in Sample 25, and about 310 µm in Sample 26.

Each of W1 and W2 was set at about 60 µm in Sample 1, about 100 µm in Sample 2, about 150 µm in Sample 3, about 200 µm in Sample 4, about 60 µm in Sample 5, about 60 µm in Sample 6, about 60 µm in Sample 7, about 60 µm in Sample 8, about 60 µm in Sample 9, about 60 µm in Sample 10, about 60 µm in Sample 11, about 60 µm in Sample 12, about 60 µm in Sample 13, about 60 µm in Sample 14, about 60 µm in Sample 15, about 60 µm in Sample 16, about 60 µm in Sample 17, about 60 µm in Sample 18, about 60 µm in Sample 19, about 60 µm in Sample 20, about 60 µm in Sample 21, about 60 µm in Sample 22, about 60 µm in Sample 23, about 60 µm in Sample 24, about 60 µm in Sample 25, and about 60 µm in Sample 26.

Each of T1 and T2 was set at about 60 µm in Sample 1, about 60 µm in Sample 2, about 60 µm in Sample 3, about 60 µm in Sample 4, about 100 µm in Sample 5, about 150 µm in Sample 6, about 200 µm in Sample 7, about 60 µm in Sample 8, about 60 µm in Sample 9, about 60 µm in Sample 10, about 60 µm in Sample 11, about 60 µm in Sample 12, about 60 µm in Sample 13, about 60 µm in Sample 14, about 60 µm in Sample 15, about 60 µm in Sample 16, about 60 µm in Sample 17, about 60 µm in Sample 18, about 60 µm in Sample 19, about 60 µm in Sample 20, about 60 µm in Sample 21, about 60 µm in Sample 22, about 60 µm in Sample 23, about 60 µm in Sample 24, about 60 µm in Sample 25, and about 60 µm in Sample 26.

$(L1+L2)/$ was about 0.105 in Sample 1, about 0.105 in Sample 2, about 0.105 in Sample 3, about 0.105 in Sample 4, about 0.105 in Sample 5, about 0.105 in Sample 6, about 0.105 in Sample 7, about 0.174 in Sample 8, about 0.192 in Sample 9, about 0.209 in Sample 10, about 0.226 in Sample 11, about 0.244 in Sample 12, about 0.261 in Sample 13, about 0.279 in Sample 14, about 0.296 in Sample 15, about 0.314 in Sample 16, about 0.331 in Sample 17, about 0.348 in Sample 18, about 0.366 in Sample 19, about 0.383 in Sample 20, about 0.401 in Sample 21, about 0.418 in Sample 22, about 0.436 in Sample 23, about 0.488 in Sample 24, about 0.523 in Sample 25, and about 0.540 in Sample 26.

$(W1+W2)/W0$ was about 0.177 in Sample 1, about 0.295 in Sample 2, about 0.442 in Sample 3, about 0.590 in Sample 4, about 0.177 in Sample 5, about 0.177 in Sample 6, about 0.177 in Sample 7, about 0.177 in Sample 8, about 0.177 in Sample 9, about 0.177 in Sample 10, about 0.177 in Sample 11, about 0.177 in Sample 12, about 0.177 in Sample 13, about 0.177 in Sample 14, about 0.177 in Sample 15, about 0.177 in Sample 16, about 0.177 in Sample 17, about 0.177 in Sample 18, about 0.177 in Sample 19, about 0.177 in Sample 20, about 0.177 in Sample 21, about 0.177 in Sample 22, about 0.177 in Sample 23, about 0.177 in Sample 24, about 0.177 in Sample 25, and about 0.177 in Sample 26.

$(T1+T2)/T0$ was about 0.178 in Sample 1, about 0.178 in Sample 2, about 0.178 in Sample 3, about 0.178 in Sample 4, about 0.296 in Sample 5, about 0.444 in Sample 6, about 0.593 in Sample 7, about 0.178 in Sample 8, about 0.178 in Sample 9, about 0.178 in Sample 10, about 0.178 in Sample 11, about 0.178 in Sample 12, about 0.178 in Sample 13, about 0.178 in Sample 14, about 0.178 in Sample 15, about 0.178 in Sample 16, about 0.178 in Sample 17, about 0.178 in Sample 18, about 0.178 in Sample 19, about 0.178 in Sample 20, about 0.178 in Sample 21, about 0.178 in Sample 22, about 0.178 in Sample 23, about 0.178 in Sample 24, about 0.178 in Sample 25, and about 0.178 in Sample 26.

Therefore, in Sample 1 and Sample 8, $(L1+L2)/L0<(W1+W2)/W0$ and $(L1+L2)/L0<(T1+T2)/T0$. In Sample 2 to Sample 4, $(W1+W2)/W0>(L1+L2)/L0$ and $(W1+W2)/W0>(T1+T2)/T0$. In Sample 5 to Sample 7, $(T1+T2)/T0>(L1+L2)/L0$ and $(T1+T2)/T0>(W1+W2)/W0$. In Sample 9 to Sample 26, $(L1+L2)/L0>(W1+W2)/W0$ and $(L1+L2)/L0>(T1+T2)/T0$.

The capacitance of the multilayer ceramic capacitor was about 10.0 µF in Sample 1, about 8.48 µF in Sample 2, about 6.58 µF in Sample 3, about 4.69 µF in Sample 4, about 8.45 µF in Sample 5, about 6.50 µF in Sample 6, about 4.56 µF in Sample 7, about 9.17 µF in Sample 8, about 8.97 µF in Sample 9, about 8.76 µF in Sample 10, about 8.55 µF in Sample 11, about 8.35 µF in Sample 12, about 8.14 µF in Sample 13, about 7.93 µF in Sample 14, about 7.72 µF in Sample 15, about 7.52 µF in Sample 16, about 7.31 µF in Sample 17, about 7.10 µF in Sample 18, about 6.90 µF in Sample 19, about 6.69 µF in Sample 20, about 6.48 µF in Sample 21, about 6.28 µF in Sample 22, about 6.07 µF in Sample 23, about 5.45 µF in Sample 24, about 5.04 µF in Sample 25, and about 4.83 µF in Sample 26.

The amplitude of vibrations of the substrate having the multilayer ceramic capacitor mounted thereon was about 26.53 nm in Sample 1, about 24.07 nm in Sample 2, about 20.13 nm in Sample 3, about 15.25 nm in Sample 4, about 19.97 nm in Sample 5, about 13.96 nm in Sample 6, about 10.29 nm in Sample 7, about 22.32 nm in Sample 8, about 21.32 nm in Sample 9, about 20.30 nm in Sample 10, about 19.26 nm in Sample 11, about 18.15 nm in Sample 12, about 17.15 nm in Sample 13, about 15.72 nm in Sample 14, about 14.40 nm in Sample 15, about 13.14 nm in Sample 16, about 11.85 nm in Sample 17, about 10.47 nm in Sample 18, about 9.32 nm in Sample 19, about 8.17 nm in Sample 20, about 7.24 nm in Sample 21, about 6.30 nm in Sample 22, about 5.33 nm in Sample 23, about 3.88 nm in Sample 24, about 3.50 nm in Sample 25, and about 3.41 nm in Sample 26.

Figure 7:
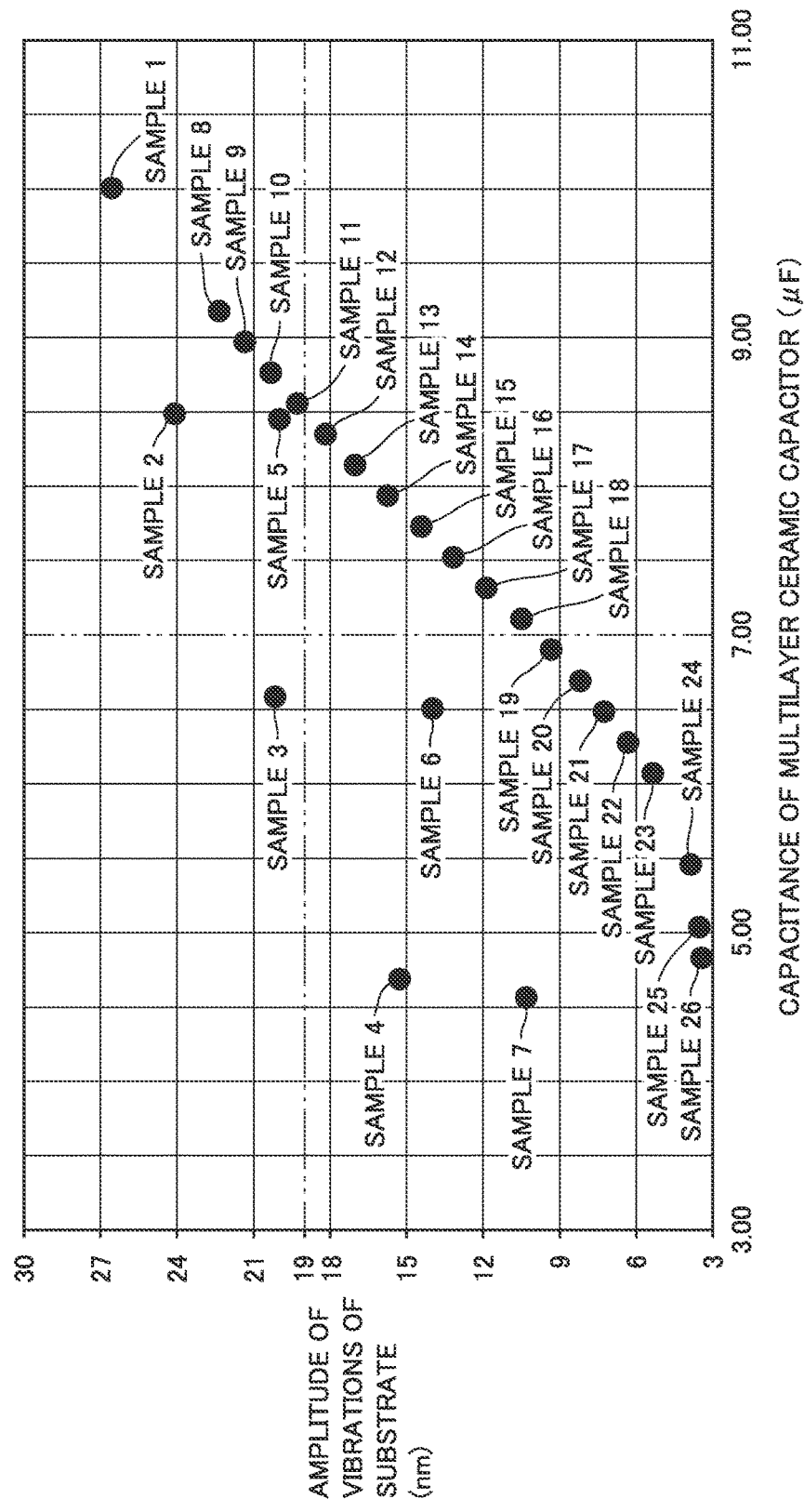
FIG. 7 is a graph illustrating a result of the present experiment example.

FIG. 7 is a graph illustrating the results of the present experimental example. In FIG. 7, the vertical axis represents the amplitude (nm) of vibrations of the substrate including the multilayer ceramic capacitor mounted thereon, and the horizontal axis represents the capacitance (µF) of the multilayer ceramic capacitor.

As the multilayer-ceramic-capacitor-mounted structure, it is preferable that the capacitance of the multilayer ceramic capacitor is not less than about 7 µF and the amplitude of vibrations of the substrate having the multilayer ceramic capacitor mounted thereon is not more than about 19 nm. In FIG. 7, each of a position where the capacitance of the multilayer ceramic capacitor is about 7 µF and a position where the amplitude of vibrations of the substrate having the multilayer ceramic capacitor mounted thereon is about 19 nm is indicated by a two-dot chain line. The samples satisfying the above-described preferable conditions are Sample 12 to Sample 18 located in the lower right region of the four regions separated by the two two-dot chain lines in the graph of FIG. 7.

Each of Sample 12 to Sample 18 satisfies the conditions of $(L1+L2)/L0>(W1+W2)/W0$ and $(L1+L2)/L0>(T1+T2)/T0$, and also satisfies the condition of $0.244 \leq (L1+L2)/L0 \leq 0.348$.

Since the conditions of $(L1+L2)/L0>(W1+W2)/W0$ and $(L1+L2)/L0>(T1+T2)/T0$ are satisfied, a distortion occurring on first end surface 115 and second end surface 116 of stacked body 110 by the application of a voltage to multilayer ceramic capacitor 100 illustrated in FIG. 6 is reduced.

Therefore, the vibrations propagating through first external electrode 120, solder 12 and land 11 to substrate 10 are reduced. Similarly, the vibrations propagating through second external electrode 130, solder 12 and land 11 to substrate 10 are reduced. As a result, the amplitude of vibrations of substrate 10 is reduced.

In addition, multilayer ceramic capacitor 100 satisfies the conditions of L0>W0 and L0>T0. Therefore, by increasing (L1+L2)/L0, rather than increasing (W1 +W2)/W0 or (T1+T2)/T0, in order to reduce the amplitude of vibrations of substrate 10, a larger volume of inner layer portion C illustrated in FIG. 2 to FIG. 6 is ensured. As a result, as illustrated in FIG. 7, in Sample 9 to Sample 26 satisfying the conditions of (L1+L2)/L0>(W1 +W2)/W0 and (L1+L2)/L0>(T1+T2)/T0, a reduction in capacitance of the multilayer ceramic capacitor is reduced or prevented, and the amplitude of vibrations of the substrate including the multilayer ceramic capacitor mounted thereon is reduced and an acoustic noise caused by the multilayer ceramic capacitor is reduced, as compared with Sample 2 to Sample 4 satisfying the conditions of (W1 +W2)/W0>(L1+L2)/L0 and (W1 +W2)/W0>(T1+T2)/T0 and Sample 5 to Sample 7 satisfying the conditions of (T1+T2)/T0>(L1+L2)/L0 and (T1+T2)/T0>(W1 +W2)/W0.

Because T1=T2 in multilayer ceramic capacitor 100, the acoustic noise is effectively reduced even if any of first main surface 111 and second main surface 112 of multilayer ceramic capacitor 100 faces the surface of substrate 10 when multilayer ceramic capacitor 100 is mounted on substrate 10. Therefore, mounting of multilayer ceramic capacitor 100 on substrate 10 is facilitated.

Multilayer ceramic capacitor 100 is a small-sized and high-capacitance multilayer ceramic capacitor in which, preferably, a dimension in length direction L is not larger than about 2.0 mm, a dimension in width direction W is not larger than about 1.25 mm, and a dimension in stacking direction T is not larger than about 1.25 mm, for example. It is a remarkable effect in the small-sized and high-capacitance multilayer ceramic capacitor that the configuration of multilayer ceramic capacitor 100 according to the present preferred embodiment enables a reduction or prevention of a reduction in capacitance of multilayer ceramic capacitor 100 and reduction of the acoustic noise caused by multilayer ceramic capacitor 100. This effect is not required for a large-sized or low-capacitance multilayer ceramic capacitor.

As illustrated in FIG. 7, in Sample 9 to Sample 26 satisfying the conditions of (L1+L2)/L0>(W1 +W2)/W0 and (L1+L2)/L0>(T1+T2)/T0, (L1+L2)/L0<0.53 is necessary to ensure a capacitance equal to or higher than about 50% of the capacitance of the multilayer ceramic capacitor of Sample 1 satisfying the condition of L1 (L2)=W1 (W2)=T1 (T2). (L1+L2)/L0<0.39 is necessary to ensure a capacitance equal to or higher than about 66.7%. (L1+L2)/L0<0.32 is necessary to ensure a capacitance equal to or higher than about 75%.

As illustrated in FIG. 7, in Sample 9 to Sample 26 satisfying the conditions of (L1+L2)/L0>(W1 +W2)/W0 and (L1+L2)/L0>(T1+T2)/T0, (L1+L2)/L0≥0.2 is necessary to reduce the amplitude to be equal to or less than about 80% of the amplitude of vibrations of the substrate on which the multilayer ceramic capacitor of Sample 1 satisfying the condition of L1 (L2)=W1 (W2)=T1 (T2) is mounted. (L1+L2)/L0≥0.26 is necessary to reduce the amplitude to be equal to or less than about 65%. (L1+L2)/L0≥0.31 is necessary to reduce the amplitude to be equal to or less than about 50%.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A multilayer ceramic capacitor comprising:
a stacked body including a plurality of dielectric layers and a plurality of internal electrode layers alternately stacked along a stacking direction, the stacked body including a first main surface and a second main surface facing each other in the stacking direction, a first side surface and a second side surface facing each other in a width direction orthogonal or substantially orthogonal to the stacking direction, and a first end surface and a second end surface facing each other in a length direction orthogonal or substantially orthogonal to both of the stacking direction and the width direction;
a first external electrode provided on the first end surface; and
a second external electrode provided on the second end surface; wherein
the plurality of internal electrode layers include a first internal electrode layer connected to the first external electrode and a second internal electrode layer connected to the second external electrode;
the stacked body is partitioned into an inner layer portion, a first outer layer portion, a second outer layer portion, a first side margin, a second side margin, a first end margin, and a second end margin, the inner layer portion being a portion in which facing portions of the first internal electrode layer and the second internal electrode layer facing each other are stacked in the stacking direction to provide a capacitance, the first outer layer portion being located on a first main surface side of the inner layer portion in the stacking direction, the second outer layer portion being located on a second main surface side of the inner layer portion in the stacking direction, the first side margin being located on a first side surface side of the inner layer portion in the width direction, the second side margin being located on a second side surface side of the inner layer portion in the width direction, the first end margin being located on a first end surface side of the inner layer portion in the length direction, and the second end margin being located on a second end surface side of the inner layer portion in the length direction;
when a dimension of the stacked body in the length direction is defined as L0, a dimension of the stacked body in the width direction is defined as W0, a dimension of the stacked body in the stacking direction is defined as T0, a dimension of the first outer layer portion in the stacking direction is defined as T1, a dimension of the second outer layer portion in the stacking direction is defined as T2, a dimension of the first side margin in the width direction is defined as W1, a dimension of the second side margin in the width direction is defined as W2, a dimension of the first end margin in the length direction is defined as L1, and a dimension of the second end margin in the length direction is defined as L2,
conditions of (L1+L2)/L0>(W1+W2)/W0 and (L1+L2)/L0>(T1+T2)/T0 are satisfied; and
a condition of 0.244≤(L1+L2)/L0≤0.32 is satisfied.

2. The multilayer ceramic capacitor according to claim 1, wherein T1=T2.

3. The multilayer ceramic capacitor according to claim 1, wherein the stacked body has a rectangular or substantially rectangular parallelepiped outer shape.

4. The multilayer ceramic capacitor according to claim 1, wherein the dimension of the stacked body in length direction is not larger than about 1.75 mm, the dimension of the stacked body in width direction is not larger than about 0.95 mm, and the dimension of the stacked body in stacking direction is not larger than about 0.95 mm.

5. The multilayer ceramic capacitor according to claim 1, wherein a dimension of the multilayer ceramic capacitor in the length direction is not larger than about 2.0 mm, a dimension of the multilayer ceramic capacitor in width direction is not larger than about 1.25 mm, and a dimension of the multilayer ceramic capacitor in stacking direction is not larger than about 1.25 mm.

6. The multilayer ceramic capacitor according to claim 1, wherein a corner portion and a ridge portion of the stacked body are rounded, the corner portion is a portion where three surfaces of the stacked body intersect with one another, and the ridge portion is a portion where two surfaces of the stacked body intersect with each other.

7. The multilayer ceramic capacitor according to claim 1, wherein W1=W2.

8. The multilayer ceramic capacitor according to claim 1, wherein L1=L2.

9. The multilayer ceramic capacitor according to claim 1, wherein a thickness of each of the plurality of dielectric layers is not smaller than about 0.5 μm and not greater than about 5 μm.

10. The multilayer ceramic capacitor according to claim 1, wherein a thickness of each of the plurality of dielectric layers not smaller than about 0.5 μm and not greater than about 2 μm.

11. The multilayer ceramic capacitor according to claim 1, wherein each of the plurality of dielectric layers is composed of a Perovskite compound including Ba or Ti.

12. The multilayer ceramic capacitor according to claim 11, wherein each of the plurality of dielectric layers is composed of dielectric ceramics primarily composed of $BaTiO_3$, $CaTiO_3$, $SrTiO_3$, or $CaZrO_3$.

13. The multilayer ceramic capacitor according to claim 12, wherein each of the plurality of dielectric layers include at least one of an Mn compound, an Mg compound, an Si compound, an Fe compound, a Cr compound, a Co compound, an Ni compound, an Al compound, a V compound, or a rare earth compound as a sub-component.

14. The multilayer ceramic capacitor according to claim 13, wherein each of the plurality of dielectric layers has a dielectric constant of not lower than about 1000.

15. The multilayer ceramic capacitor according to claim 1, wherein a thickness of each of the plurality of internal electrode layers is not smaller than about 0.3 μm and not greater than about 1.0 μm.

16. The multilayer ceramic capacitor according to claim 1, wherein each of the first and second external electrodes includes a base electrode layer and a plated layer provided on the base electrode layer.

17. The multilayer ceramic capacitor according to claim 16, wherein a thickness of the base electrode layer is not smaller than about 10 μm and not greater than about 50 μm.

18. A multilayer-ceramic-capacitor-mounted structure comprising:
the multilayer ceramic capacitor as recited in claim 1; and
a substrate including the multilayer ceramic capacitor mounted on a surface thereof; wherein
the stacking direction is perpendicular or substantially perpendicular to the surface of the substrate.

* * * * *